(12) United States Patent
Saimen

(10) Patent No.: US 7,901,528 B2
(45) Date of Patent: Mar. 8, 2011

(54) METHOD FOR MANUFACTURING WIRING SUBSTRATE HAVING SHEET

(75) Inventor: Munehide Saimen, Suwa (JP)

(73) Assignee: Seiko Epson Corporation (JP)

( * ) Notice: Subject to any disclaimer, the term of this patent is extended or adjusted under 35 U.S.C. 154(b) by 740 days.

(21) Appl. No.: 11/856,776

(22) Filed: Sep. 18, 2007

(65) Prior Publication Data

US 2008/0078491 A1 Apr. 3, 2008

(30) Foreign Application Priority Data

Sep. 19, 2006 (JP) ................................. 2006-252559

(51) Int. Cl.
*B32B 37/00* (2006.01)
(52) U.S. Cl. .......................................................... 156/87
(58) Field of Classification Search ...................... 156/87
See application file for complete search history.

(56) References Cited

U.S. PATENT DOCUMENTS 7,703,657 B2 * 4/2010 Matsumura et al. ........... 228/5.5

FOREIGN PATENT DOCUMENTS

| JP | 60-236242 A | * | 11/1985 |
| JP | 2-78969 A | * | 3/1990 |
| JP | 05-021511 | | 1/1993 |
| JP | 10-107088 | | 4/1998 |
| JP | 2004-281460 A | * | 10/2004 |
| JP | 2005-150372 | | 6/2005 |
| JP | 2005-150373 | | 6/2005 |
| JP | 2005-150374 | | 6/2005 |
| JP | 2006-147763 | | 6/2006 |
| JP | 2006-148018 | | 6/2006 |
| JP | 2006-177764 | | 7/2006 |
| JP | 2006-269492 | | 10/2006 |

OTHER PUBLICATIONS

Machine Translation of JP 2004-281460, date unknown.*

* cited by examiner

*Primary Examiner* — Jeff H Aftergut
(74) *Attorney, Agent, or Firm* — Harness, Dickey & Pierce, P.L.C.

(57) ABSTRACT

A method for manufacturing a wiring substrate having a sheet, including: (a) arranging a wiring substrate and a sheet between a board and a tool in a manner that a resin layer comes between the wiring substrate and the sheet, one surface of the wiring substrate being a concave/convex surface and the other surface being flat, and both surfaces of the sheet being flat; (b) pressing the wiring substrate, the resin layer, and the sheet using the board and the tool so as to adhere the resin layer to both the wiring substrate and the sheet, in that: the board having a flat surface is arranged in a manner that the flat surface faces the tool; the tool contains an elastic body having a projecting part projecting in a direction of the board; the resin layer is arranged so as to overlap with a concave part and a convex part of the concave/convex surface; and the pressing step (b) starts with a tip of the projecting part of the tool and the flat surface of the board and proceeds while expanding a pressing surface of the tool by widening a tip plane of the projecting part using deformation of the elastic body.

12 Claims, 6 Drawing Sheets

METHOD FOR MANUFACTURING WIRING SUBSTRATE HAVING SHEET

The entire disclosure of Japanese Patent Application No. 2006-252559, filed Sep. 19, 2006 is expressly incorporated by reference herein.

BACKGROUND

1. Technical Field

The present invention relates to a method for manufacturing a wiring substrate having a sheet.

2. Related Art

To attach a wiring substrate to a sheet such as a reinforcing sheet, a light-shielding sheet, or a noise suppressing metal sheet, a resin layer may be used as a bonding agent or adhesive agent. Because a wiring pattern, a solder resist layer, and the like are mounted on the wiring substrate, the wiring substrate has an irregular concave/convex surface. It is therefore difficult to evenly and uniformly bond and adhere the wiring substrate, the resin layer, and the sheet to each other by pressing, without forming voids between the wiring substrate or the sheet and the resin layer that is located at a concave portion of the substrate surface.

JP-A-10-107088 discloses a technique for revising a shape of a bonding tool. However, this technique is not for preventing the voids.

SUMMARY

An advantage of the invention is to provide a method for bonding/adhering a sheet to a wiring substrate with a resin layer without forming voids.

According to an aspect of the invention, a method for manufacturing a wiring substrate having a sheet includes: (a) arranging a wiring substrate and a sheet between a board and a tool in a manner that a resin layer comes between the wiring substrate and the sheet, one surface of the wiring substrate being a concave/convex surface and the other surface being flat, and both surfaces of the sheet being flat; (b) pressing the wiring substrate, the resin layer, and the sheet using the board and the tool so as to adhere the resin layer to both the wiring substrate and the sheet, in that: the board having a flat surface is arranged in a manner that the flat surface faces the tool; the tool contains an elastic body having a projecting part projecting in a direction of the board; the resin layer is arranged so as to overlap with a concave part and a convex part of the concave/convex surface; and the pressing step (b) starts with a tip of the projecting part of the tool and the flat surface of the board and proceeds while expanding a pressing surface of the tool by widening a tip plane of the projecting part using deformation of the elastic body.

It is preferable that the wiring substrate be provided with a solder resist layer that covers a wiring pattern excluding a portion of the wiring pattern.

It is preferable that the method further include: proceeding with step (b) while expanding the pressing surface in one direction along a second straight line that is perpendicular to a first straight line, the projecting part having a configuration in which the tip thereof is elongated along the first straight line and located at an end portion of the projecting part.

It is preferable that the method further include: arranging the wiring pattern between the board and the tool in step (a) in a manner that the direction matches with a direction in which an interval between adjacent wiring lines of a plurality of wiring lines widens, the plurality of wiring lines extending as the portion of the wiring pattern while widening the interval between the adjacent wiring lines.

It is preferable that the method further include: proceeding with step (b) while expanding the pressing surface in both directions along a fourth straight line that is perpendicular to a third straight line, the projecting part having a configuration in which the tip thereof is elongated along the third straight line and located at a center of the projecting part.

It is preferable that the method further include: arranging the wiring pattern between the board and the tool in step (a) in a manner that the both directions match with a direction in which a plurality of wiring lines extend, the plurality of wiring lines extending in parallel as the portion of the wiring pattern.

It is preferable that, in the method, the wiring substrate be provided with a second solder resist layer that covers a second wiring pattern excluding a portion of the second wiring pattern, and the portion exposed from the second solder resist layer contain an enclosed region surrounded by the second solder resist layer.

It is preferable that the method further include: overlapping the tip of the projecting part with the enclosed region in step (a), the projecting part having a configuration in which the tip thereof is located in a center of the projecting part; and proceeding with the pressing of step (b) while expanding pressing surface in both directions of two straight lines that are perpendicular to each other.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
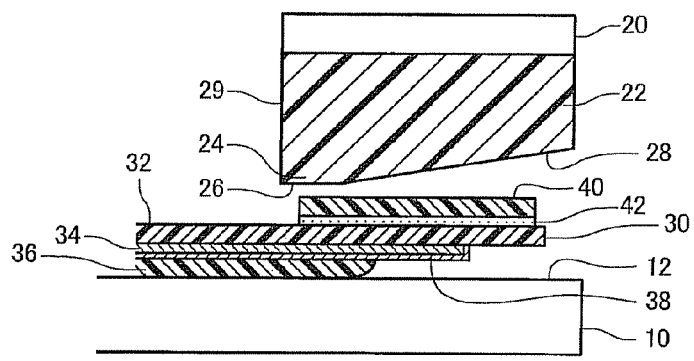
FIGS. 1A through 1D are diagrams to show a method for manufacturing a wiring substrate having a sheet according to a first embodiment of the invention.

Embodiments of the invention will now be described with reference to the drawings.

First Embodiment

FIGS. 1A through 1D are diagrams showing a method for manufacturing a wiring substrate having a sheet according to the first embodiment of the invention. FIG. 2 is a plan diagram of the wiring substrate used in the method for manufacturing a wiring substrate having a sheet according to the first embodiment of the invention.

In the present embodiment, a board 10 and a tool 20 are used. The board 10 has a flat surface 12 and is arranged in a manner that the surface 12 faces the tool 20 (faces upward). A material for the board 10 is not particularly limited but is preferably a hard material such as metal or ceramic. The tool 20 includes an elastic body 22. The elastic body 22 (made of rubber, silicone rubber, etc.) has a projecting part 24 projecting in a direction of the board 10 (downward). The projecting part 24 has a configuration (rectangular in the example of FIG. 1A) in which a tip (a tip plane 26 in the example of FIG. 1A) of the projecting part 24 is elongated along a first straight line $L_1$ (see FIG. 2). Because of its elasticity, the elastic body 22 is deformed in a manner that the tip plane 26 becomes larger in one direction along a second straight line $L_2$ (in the right direction in FIGS. 1A through 1D and FIG. 2) that is perpendicular to the first straight line $L_1$. Specifically, one side of the tip plane 26 of the projecting part 24 of the elastic body 22 is joined to a sloping plane 28 at an internally obtuse angle, and another side of the tip plane 26 remote from the one side is joined to a plane 29 at an internally right or acute angle. In other words, the projecting part 24 is formed so that an end portion thereof becomes the tip plane 26.

A wiring substrate 30 includes a substrate 32 made of e.g. resin (such as a flexible substrate) and a wiring pattern 34 mounted on the substrate 32. The wiring substrate 30 (e.g., a flexible printed circuit (FPC)) is used when manufacturing semiconductor apparatuses that employ chip on film (COF). When reel-to-reel transfer is employed, the substrate 32 is in a shape of tape. A solder resist layer 36 is formed covering the wiring pattern 34 but not covering a portion of the wiring pattern 34. One surface of the wiring substrate 30 is a concave/convex surface and the other surface is flat. The solder resist layer 36 is the convex part, and a region of the substrate 32 excluding the solder resist layer 36 is the concave part. As the portion of the wiring pattern 34, a plurality of wiring lines 38 extend at the portion of the wiring substrate 30 exposed from the solder resist layer 36. The interval of the wiring lines 38 widens as they extend away from the portion overlapping with the solder resist layer 36 (see FIG. 2).

A sheet 40 is flat on both surfaces. The sheet 40 may be made of a flexible material such as resin or of a hard material such as semiconductor (e.g. silicon). The sheet 40 has a function of a reinforcing sheet, a light-shielding sheet, or a noise-suppressing metal sheet. The sheet 40 is provided with a resin layer 42 that is a bonding/adhesive agent, before being mounted on the wiring substrate 30.

Figure 2:
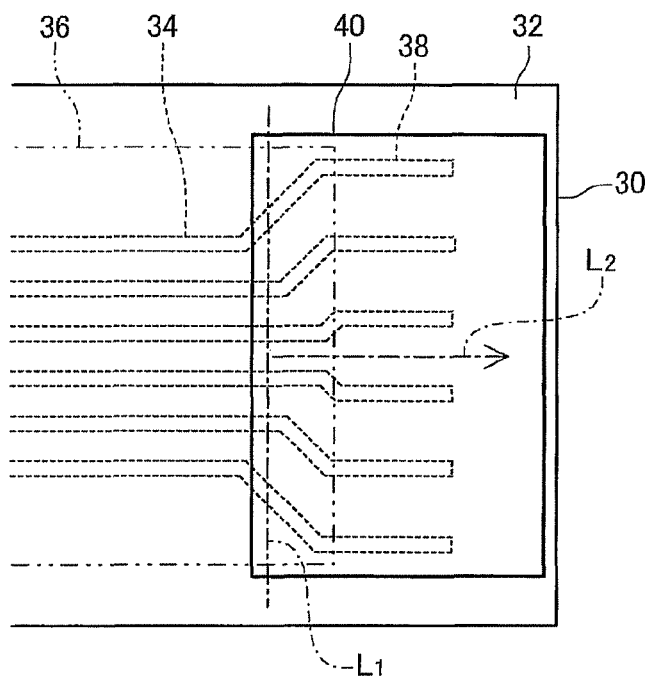
FIG. 2 is a plan diagram of the wiring substrate used in the method for manufacturing a wiring substrate having a sheet according to the first embodiment of the invention.

With reference to FIG. 1A, the wiring substrate 30 and the sheet 40 are arranged between the board 10 and the tool 20. The wiring substrate 30 is arranged in a manner that its concave/convex surface (on which the solder resist layer 36 is mounted) faces the board 10. The resin layer 42 comes between the wiring substrate 30 and the sheet 40. Specifically, the resin layer 42 is arranged so as to overlap with the convex and concave parts of the concave/convex surface of the wiring substrate 30. Also, the wiring substrate 30 is arranged so that the convex part (the solder resist layer 36) overlaps with the projecting part 24 of the tool 20.

Figure 1B:
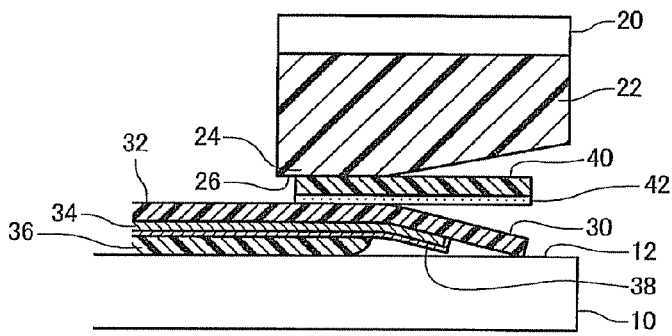
Figure 1C:
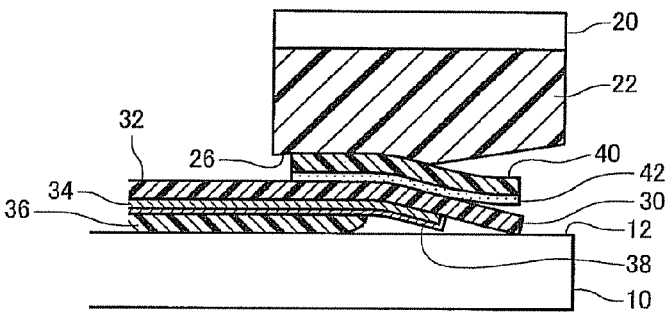
Figure 1D:
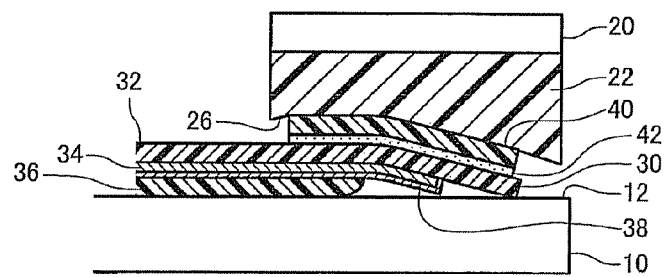

Referring to FIG. 1B, the wiring substrate 30, the resin layer 42, and the sheet 40 are pressed by the board 10 and the tool 20. The pressing starts with the tip of the projecting part 24 of the tool 20 and the flat surface 12 of the board 10. Referring to FIGS. 1C and 1D, the pressing proceeds as a pressing surface of the tool 20 expands while widening the tip plane 26 of the projecting part 24 using deformation of the elastic body 22. For example, the pressing proceeds while expanding the pressing surface in one direction (in the right direction in FIGS. 1A through 1D and FIG. 2) along the second straight line $L_2$ (see FIG. 2). As a consequence, the resin layer 42 and the substrate 32 are attached to each other while pressing out the voids between the substrate 32 and the resin layer 42. Also, the pressing is conducted after arranging the wiring pattern 34 between the board 10 and the tool 20 so that the extension direction of the pressing surface of the tool 20 matches with the widening direction of the interval of the plurality of wiring lines 38. Because the resin constituting the resin layer 42 flows in the widening direction of the interval of the plurality of wiring lines 38, the flow is not blocked, and the voids can be pressed out. As a result, the resin layer 42 is tightly attached to both the wiring substrate 30 and the sheet 40.

In this embodiment, because the pressing proceeds while expanding the pressing surface, the sheet 40 can be bonded/adhered to the substrate by the resin layer 42 without forming the voids. The method for manufacturing a wiring substrate having a sheet may also includes a process for mounting a semiconductor chip. That is, a wiring substrate having a sheet is referred to as a wiring substrate having a sheet with a semiconductor chip mounted on the wiring substrate.

Figure 3:
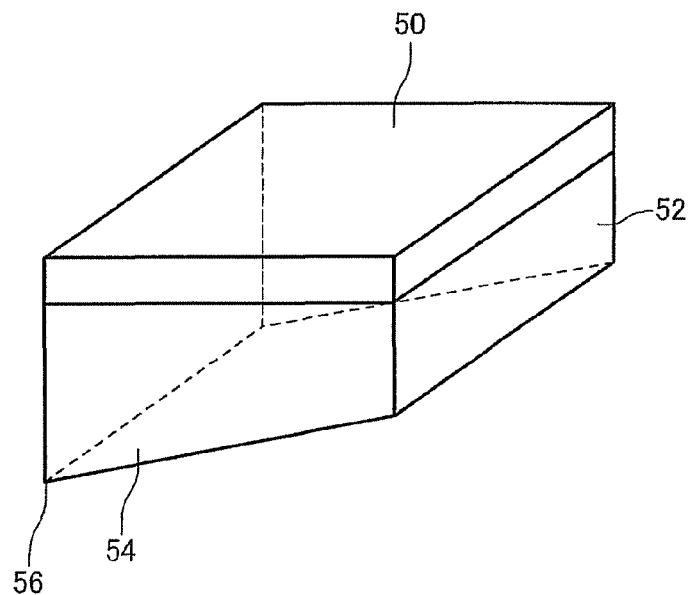
FIG. 3 is a diagram showing a modified example of a tool used in the first embodiment of the invention.

FIG. 3 is an additional diagram showing a modified example of the tool used in this embodiment. A tool 50 includes an elastic body 52. A tip 56 of a projecting part 54 of the elastic body 52 is not a plane but has a sharp-pointed configuration and comes in line contact with the sheet 40. Such a tool 50 may also be used.

Second Embodiment

Figure 4:
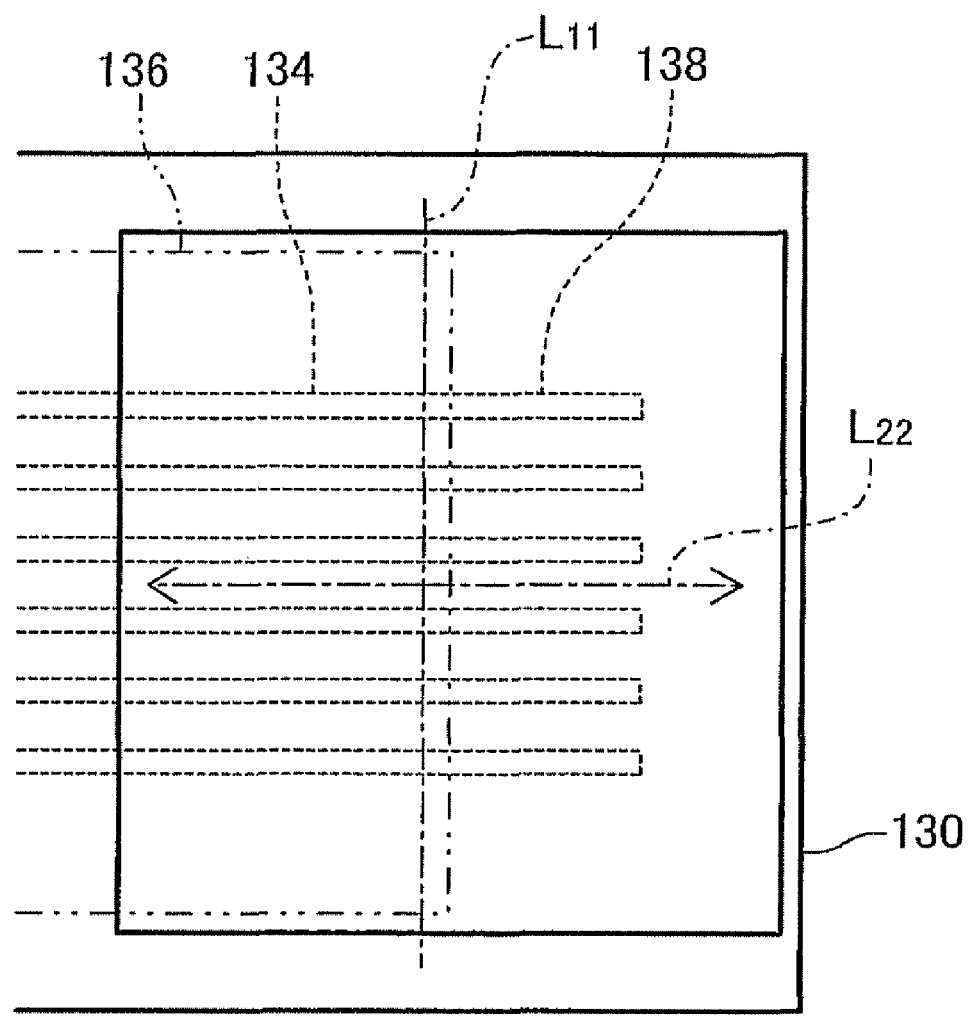
FIG. 4 is a plan diagram of a wiring substrate used in a method for manufacturing a wiring substrate having a sheet according to a second embodiment of the invention.

FIG. 4 is a plan diagram of a wiring substrate used in a method for manufacturing a wiring substrate having a sheet according to the second embodiment of the invention. A plurality of wiring lines 138 extend in parallel to each other as a portion of a wiring pattern 134 at a portion of a wiring substrate 130 exposed from a solder resist layer 136.

Figure 5A:
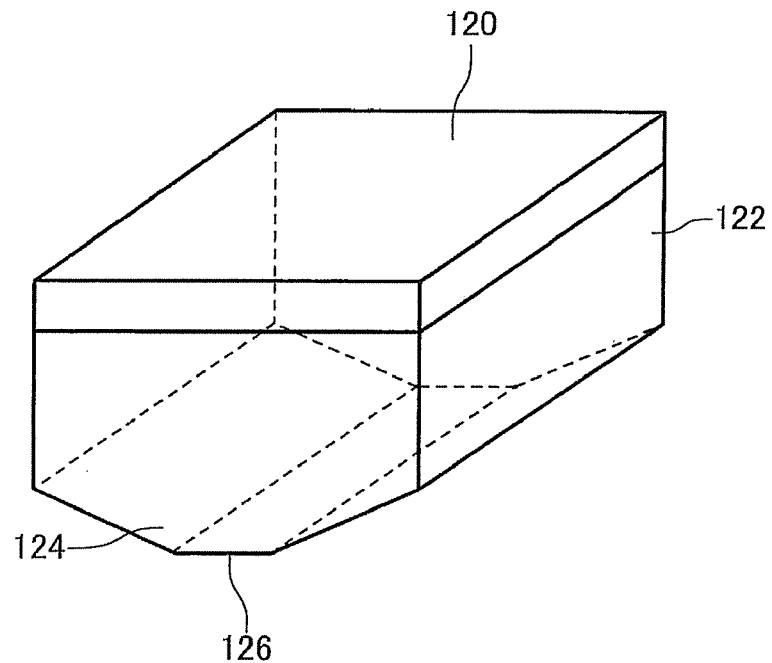
FIG. 5A is a diagram showing a tool used in the method for manufacturing a wiring substrate having a sheet according to the second embodiment of the invention.

FIG. 5A is a diagram showing a tool used in the method for manufacturing a wiring substrate having a sheet according to the second embodiment of the invention. A projecting part 124 of an elastic body 122 of a tool 120 has a tip plane 126. The tip plane 126 has an elongated configuration (rectangular in the example of FIG. 5) along a straight line $L_{11}$ (see FIG. 4). Also, the projecting part 124 is formed so that the center thereof becomes the tip plane 126. Thus, the tip plane 126 of the elastic body 122 becomes larger by deformation in both directions along a straight line $L_{22}$ that is perpendicular to the straight line $L_{11}$ (see FIG. 4).

In this embodiment, pressing is conducted after arranging the wiring pattern 134 between the board 10 and the tool 120 as shown in FIG. 1 in a manner that the both directions along the straight lines $L_{22}$, in which a pressing surface (the tip plane 126) of the tool 120 expands, match with a direction in which the plurality of wiring lines 138 extend. Then, the pressing proceeds while expanding the pressing surface (the tip plane 126) in the both directions along the straight line $L_{22}$. Other compositions and processes that are not described herein may be included in the descriptions of the first embodiment. In the present embodiment, also, the same effect can be produced as in the first embodiment.

Figure 5B:
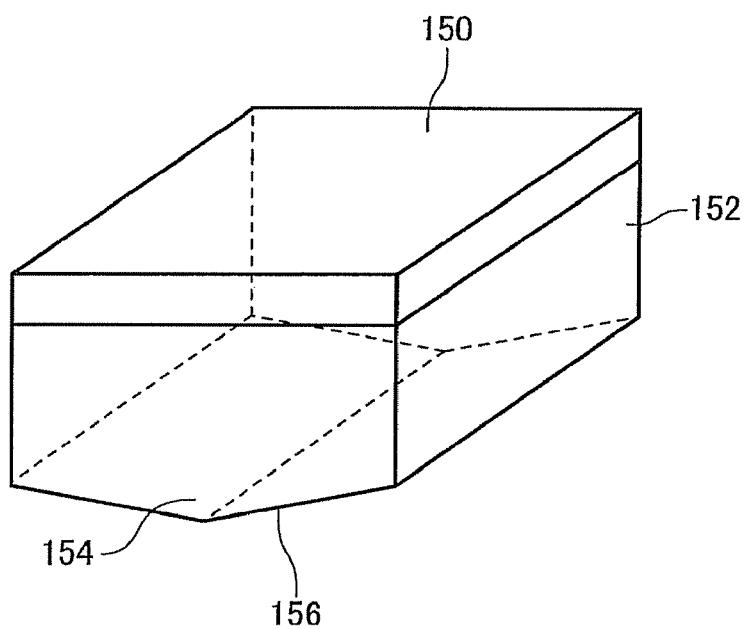
FIG. 5B is a diagram showing a modified example of the tool used in the second embodiment.

FIG. 5B is an additional diagram showing a modified example of the tool used in this embodiment. A tool 150 includes an elastic body 152. A tip 156 of a projecting part 154 of the elastic body 152 is not a plane but has a sharp-pointed configuration and comes in line contact with the sheet 40 shown in FIG. 1. Such a tool 150 may also be used.

Third Embodiment

Figure 6:
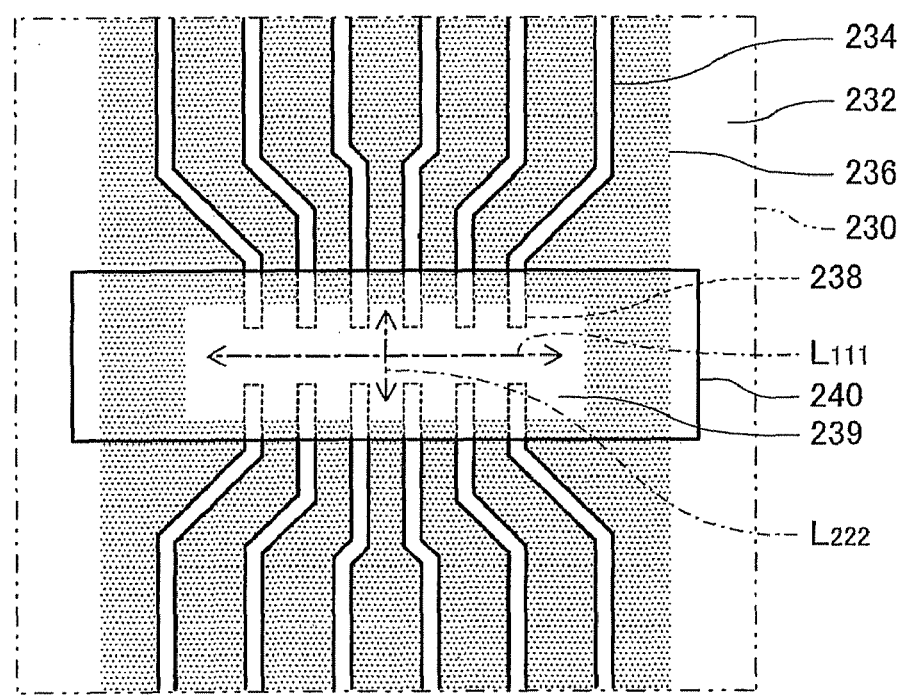
FIG. 6 is a plan diagram of a wiring substrate used in a method for manufacturing a wiring substrate having a sheet according to a third embodiment of the invention.

FIG. 6 is a plan diagram of a wiring substrate used in a method for manufacturing a wiring substrate having a sheet according to the third embodiment of the invention. The wiring substrate 130 includes the wiring pattern 134 on the rear surface of a substrate 232, in FIG. 6, and the solder resist layer 136 covering the wiring pattern 134 but not covering a portion thereof. The portion of the wiring substrate 130 exposed from the solder resist layer 136 includes an enclosed region 239 surrounded by the solder resist layer 136. Wiring lines 238 as the portion of the wiring pattern 134 are exposed from the solder resist layer 136. The solder resist layer 136 is the convex part, and the enclosed region 239 is the concave part. A sheet 240 is then attached to the surface of the substrate 232 as referred to in FIG. 6.

Figure 7:
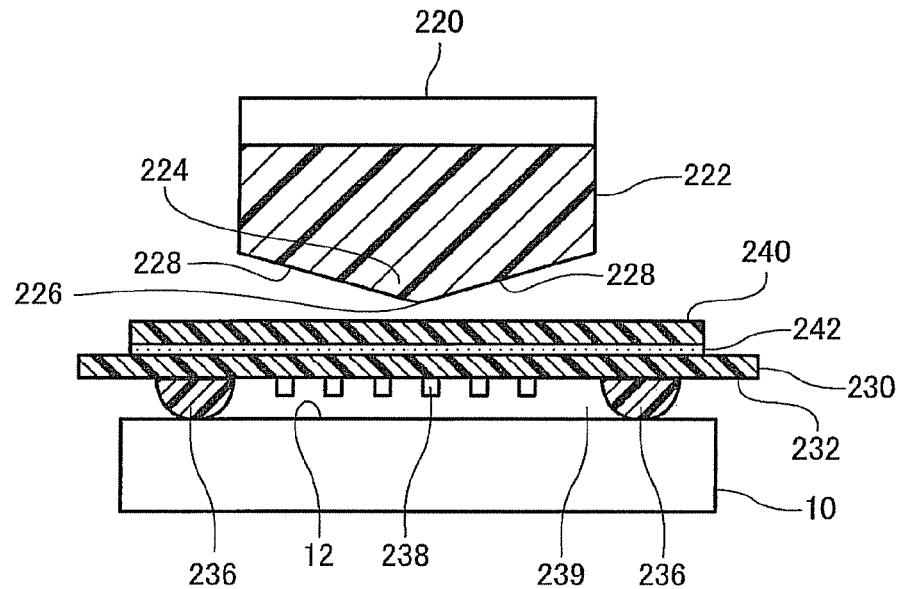
FIG. 7 is a diagram to explain the method for manufacturing a wiring substrate having a sheet according to the third embodiment of the invention.
Figure 8:
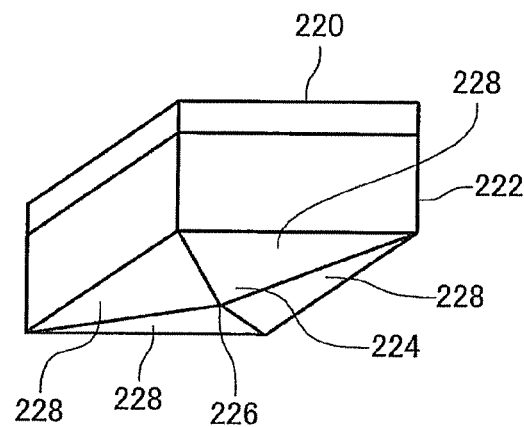
FIG. 8 is a perspective diagram of a tool used in the method for manufacturing a wiring substrate having a sheet according to the third embodiment of the invention.

FIG. 7 is a diagram to explain the method for manufacturing a wiring substrate having a sheet according to the third embodiment of the invention. FIG. 8 is a perspective diagram of a tool used in the method for manufacturing a wiring substrate having a sheet according to the third embodiment of the invention. In this embodiment, a tool 220 includes an elastic body 222. A projecting part 224 of the elastic body 222 is a part at which at least four (in the drawing, four) sloping planes are joined, and a tip 226 of the projecting part 224 has a sharp-pointed configuration. The tip 226 is located at the center of the projecting part 224. The tip 226 of the projecting part 224 comes in point contact with the sheet 240. A tip plane of the elastic body 222 becomes larger by deformation in both directions of two straight lines $L_{111}$ and $L_{222}$ that are perpendicular to each other.

Referring to FIG. 7, a wiring substrate 230, a resin layer 242, and the sheet 240 are pressed by the board 10 and the tool 220. In this embodiment, the tip 226 of the projecting part 224 of the tool 220 is arranged so as to overlap with the enclosed region 239 that has become the concave part. Then, the pressing proceeds as a pressing surface of the tool 220 expands while expanding the tip plane by deforming the tip 226 of the projecting part 224. In this embodiment, the pressing proceeds while expanding the pressing surface in both directions of the two straight lines $L_{111}$ and $L_{222}$ that are perpendicular to each other.

As a result, the resin layer 242 and the substrate 232 are attached to each other while pressing out the voids between the substrate 232 and the resin layer 242 in directions from the center to the peripheries of the concaved enclosed region 239 (towards the convex part). In this manner, the resin layer 42 is tightly attached to both the wiring substrate 30 and the sheet 40. Other compositions and processes that are not described herein may be included in the descriptions of the first embodiment. In the present embodiment, also, the same effect can be produced as in the first embodiment.

As a modified example of the tool 220, a tool having a dome-shaped elastic body may be used. Pressing may be performed by arranging an upper end portion of the dome to face the enclosed region 239 of the wiring substrate 230.

The invention is not limited to the above-described embodiments but allows various modifications. For example, the invention includes a composition that is substantially identical (e.g., having the same function, method, and result, or having the same object and result) to the composition explained in the embodiments. Also, the invention includes a composition with elements that are replaced with unessential elements of the composition explained in the embodiments. Further, the invention includes a composition that produces the same operational effect as that of the composition explained in the embodiments. Moreover, the invention includes a composition using publicly known techniques in addition to the techniques used in the composition of the embodiments.

What is claimed is:

1. A method for manufacturing a wiring substrate having a sheet, comprising:
   (a) arranging a wiring substrate and a sheet between a board and a tool in a manner that a resin layer comes between the wiring substrate and the sheet, one surface of the wiring substrate being a concave/convex surface and the other surface being flat, and both surfaces of the sheet being flat;
   (b) pressing the wiring substrate, the resin layer, and the sheet using the board and the tool so as to adhere the resin layer to both the wiring substrate and the sheet, wherein:
   the board having a flat surface is arranged in a manner that the flat surface faces the tool;
   the tool contains an elastic body having a projecting part projecting in a direction of the board, the projecting part having a tip plane that defines a first planar surface arranged parallel with the sheet, and the projecting part having a sloping plane that defines a second planar surface non-perpendicularly angled relative to the tip plane;
   the resin layer is arranged so as to overlap with a concave part and a convex part of the concave/convex surface; and
   the pressing step (b) starts with a tip of the projecting part of the tool and the flat surface of the board and proceeds while expanding a pressing surface of the tool by widening the tip plane of the projecting part using deformation of the elastic body.

2. The method for manufacturing a wiring substrate having a sheet according to claim 1,
   the wiring substrate being provided with a solder resist layer that covers a wiring pattern excluding a portion of the wiring pattern.

3. The method for manufacturing a wiring substrate having a sheet according to claim 2, further comprising:
   proceeding with step (b) while expanding the pressing surface in one direction along a second straight line that is perpendicular to a first straight line,
   the projecting part having a configuration in which the tip thereof is elongated along the first straight line and located at an end portion of the projecting part.

4. The method for manufacturing a wiring substrate having a sheet according to claim 3, further comprising:
   arranging the wiring pattern between the board and the tool in step (a) in a manner that the direction matches with a direction in which an interval between adjacent wiring lines of a plurality of wiring lines widens,
   the plurality of wiring lines extending as the portion of the wiring pattern while widening the interval between the adjacent wiring lines.

5. The method for manufacturing a wiring substrate having a sheet according to claim 2, further comprising:
   proceeding with step (b) while expanding the pressing surface in both directions along a fourth straight line that is perpendicular to a third straight line,
   the projecting part having a configuration in which the tip thereof is elongated along the third straight line and located at a center of the projecting part.

6. The method for manufacturing a wiring substrate having a sheet according to claim 5, further comprising:

arranging the wiring pattern between the board and the tool in step (a) in a manner that the both directions match with a direction in which a plurality of wiring lines extend,
the plurality of wiring lines extending in parallel as the portion of the wiring pattern.

7. The method for manufacturing a wiring substrate having a sheet according to claim 1,
the wiring substrate being provided with a second solder resist layer that covers a second wiring pattern excluding a portion of the second wiring pattern, and
the portion exposed from the second solder resist layer containing an enclosed region surrounded by the second solder resist layer.

8. The method for manufacturing a wiring substrate having a sheet according to claim 7, further comprising:
overlapping the tip of the projecting part with the enclosed region in step (a), the projecting part having a configuration in which the tip thereof is located in a center of the projecting part; and
proceeding with the pressing of step (b) while expanding the pressing surface in both directions of two straight lines that are perpendicular to each other.

9. A method for manufacturing a wiring substrate having a sheet, comprising:
arranging a wiring substrate and a sheet between a board and a pressing tool, the sheet having a resin layer formed thereon; and
engaging the pressing tool to the sheet to bond the sheet having the resin layer formed thereon to the wiring substrate;
wherein the pressing tool includes an elastic body having at least one sloping plane that defines a planar surface non-perpendicularly angled relative to a surface of the sheet;
and during engagement of the pressing tool to the sheet, the elastic body deforms such that the at least one sloping plane decreases in size such that a surface area of contact between the elastic body and the sheet increases.

10. The method of claim 9, wherein the elastic body includes a tip plane that defines a first planar surface arranged parallel with the sheet.

11. The method of claim 9, wherein the elastic body includes a second sloping plane.

12. The method of claim 11, wherein the elastic body includes third and fourth sloping planes.

\* \* \* \* \*